(12) United States Patent
Sugano

(10) Patent No.: US 7,414,440 B2
(45) Date of Patent: Aug. 19, 2008

(54) LOW VOLTAGE DETECTION CIRCUIT

(75) Inventor: Takashi Sugano, Gunma (JP)

(73) Assignee: SANYO Electric Co., Ltd., Osaka (JP)

( * ) Notice: Subject to any disclaimer, the term of this patent is extended or adjusted under 35 U.S.C. 154(b) by 153 days.

(21) Appl. No.: 11/588,424

(22) Filed: Oct. 27, 2006

(65) Prior Publication Data

US 2007/0096771 A1    May 3, 2007

(30) Foreign Application Priority Data

Oct. 27, 2005    (JP)    ............................. 2005-313041

(51) Int. Cl.
*H03K 5/153*    (2006.01)
(52) U.S. Cl. .......................................... 327/78; 327/81
(58) Field of Classification Search ............. 327/53–54, 327/56, 58–81, 142–143, 198, 541, 543
See application file for complete search history.

(56) References Cited

FOREIGN PATENT DOCUMENTS

JP    8-97694    4/1996

*Primary Examiner*—William M. Brewster
*Assistant Examiner*—Juan C Martinez
(74) *Attorney, Agent, or Firm*—Morrison & Foerster LLP

(57) ABSTRACT

A low voltage detection circuit includes a reference voltage generation circuit, a divider circuit, a comparator that serves as a comparison circuit, and a second constant current transistor connected in series with the divider circuit. An auxiliary current transistor as well as a first constant current transistor is connected in series with a load element. The auxiliary current transistor is controlled by a voltage at a drain of the second constant current transistor. A gate of the second constant current transistor and a gate of the first constant current transistor are connected with each other to form a current mirror. A size of the second constant current transistor is adjusted so that the second constant current transistor can provide a second constant current that is several times larger than a first constant current provided by the first constant current transistor.

8 Claims, 4 Drawing Sheets

FIG.2A  IMMEDIATELY AFTER POWER-ON
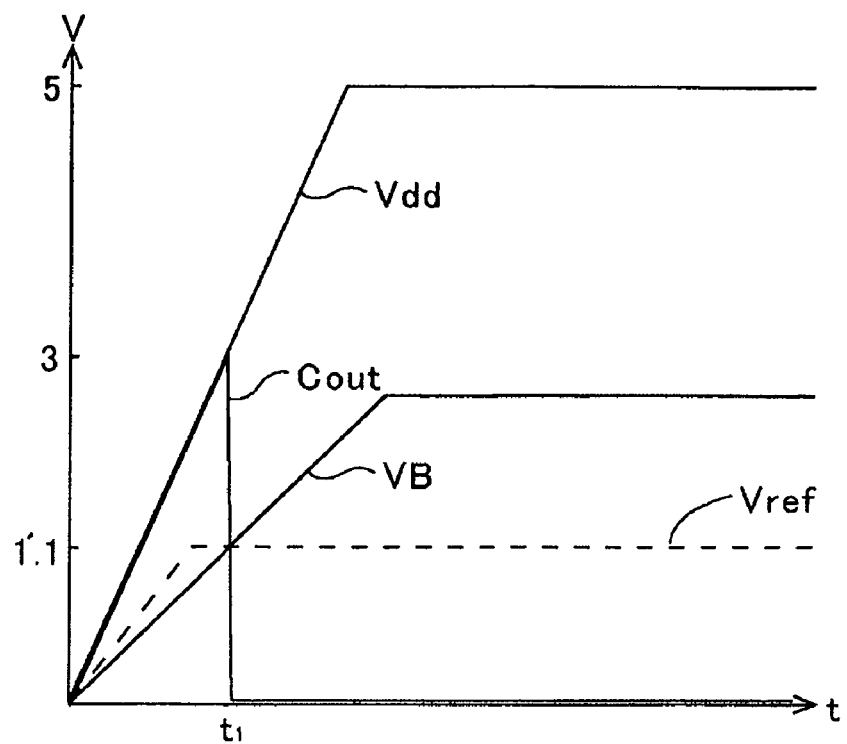
FIG.2B  DURING OPERATION
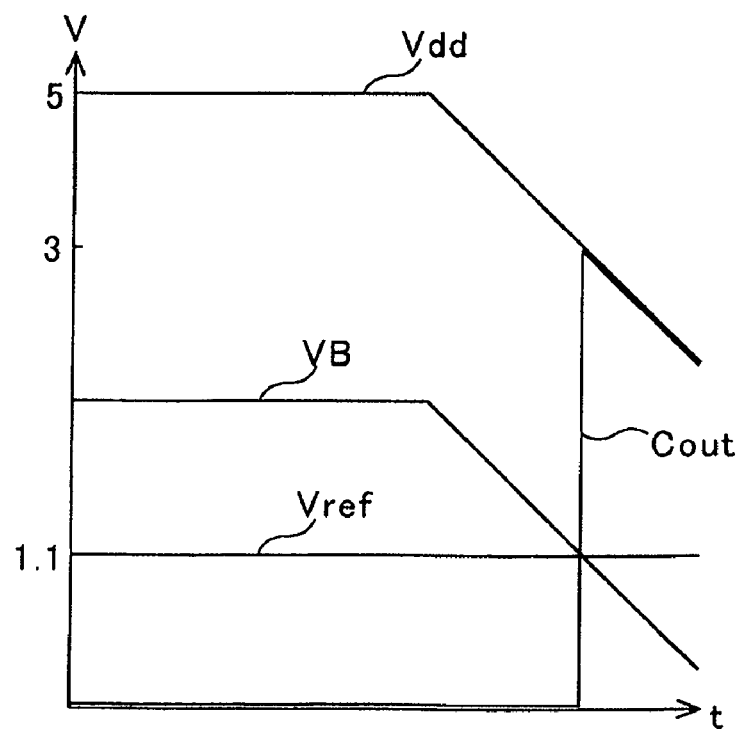

IMMEDIATELY AFTER POWER-ON

DURING OPERATION

US 7,414,440 B2

LOW VOLTAGE DETECTION CIRCUIT

CROSS-REFERENCE OF THE INVENTION

This application claims priority from Japanese Patent Application No. 2005-313041, the content of which is incorporated herein by reference in its entirety.

BACKGROUND OF THE INVENTION

1. Field of the Invention

This invention relates to a low voltage detection circuit that detects a reduction in a power supply voltage.

2. Description of the Related Art

When a power supply voltage Vdd of a microcomputer is reduced to a voltage lower than a certain reference voltage, circuit operations become unstable to cause a malfunction of the microcomputer. In order to prevent it, the microcomputer incorporates a low voltage detection circuit to detect the reduction in the power supply voltage Vdd so that the microcomputer is automatically reset when the reduction is detected. FIG. 3 shows a circuit structure of a commonly used low voltage detection circuit according to conventional art.

This commonly used low voltage detection circuit is composed of a reference voltage generation circuit 100 that outputs a reference voltage Vref of a constant voltage, a divider circuit 200 that divides the power supply voltage Vdd with divider resistors R10 and R20 and outputs a divided voltage Vb, and a comparator 110 that compares the outputs from the circuits and outputs a result of the comparison.

The reference voltage generation circuit 100 is composed of a constant current transistor M0, that generates a constant current 10, and a load element, that is formed of a resistor R30 and a diode D and is connected in series with the constant current transistor M0. The reference voltage Vref is outputted from a connecting node between the constant current transistor M0 and the load element. The outputs from the reference voltage generation circuit 100 and the divider circuit 200 are inputted to the comparator 110.

The low voltage detection circuit keeps watch on the power supply voltage Vdd, and outputs a low voltage detection signal Cout of a high level from the comparator 110 to reset (halt) the microcomputer so as to prevent malfunctioning of the microcomputer when the divided voltage Vb becomes lower than the reference voltage Vref. The low voltage detection circuit resets the microcomputer to prevent the malfunctioning not only when the power supply voltage Vdd drops during normal operation, but also when the power supply voltage Vdd remains low immediately after power-on.

The technology mentioned above is disclosed in Japanese Patent Application Publication No. H08-097694, for example.

However, there are two problems with the low voltage detection circuit described above. First, there is a problem that the high level of the low voltage detection signal Cout is not outputted when the power supply voltage Vdd and the divided voltage Vb rise abruptly after the power supply is turned on, as a consequence of delay in a rise and not reaching a desired level of the reference voltage Vref generated by the reference voltage generation circuit 100, as shown in FIG. 4A.

Second, even though the high level (=Vdd level) of the low voltage detection signal Cout is once outputted when the power supply voltage Vdd drops gradually during normal operation and becomes Vb<Vref, there is a problem that the high level of the low voltage detection signal Cout is not outputted when the power supply voltage Vdd further drops since the reference voltage Vref can not be maintained at the constant voltage level and abruptly drops to become Vb>Vref, as shown in FIG. 4B.

Therefore, when the low voltage detection circuit described above is integrated into an LSI (Large Scale Integration) such as a microcomputer, there has been a case in which the desired reset operation is not performed and subsequent malfunctioning occurs immediately after the power-on or when the power supply voltage Vdd drops during the normal operation.

SUMMARY OF THE INVENTION

This invention is directed to solve the problems addressed above and has following features. This invention offers a low voltage detection circuit having a first transistor that generates a first constant current, a load element that generates a reference voltage corresponding to the first constant current, a second transistor that generates a second constant current that is proportional to the first constant current, a divider circuit that is connected to the second transistor in series and divides a power supply voltage, a third transistor that is controlled by a voltage at a connecting node between the second transistor and the divider circuit and provides the load element with an auxiliary current and a comparator that compares the reference voltage and the power supply voltage divided by the divider circuit.

This invention also offers the low voltage detection circuit in which the first transistor and the second transistor form a current mirror.

This invention also offers a low voltage detection circuit wherein the second constant current is larger than the first constant current.

This invention also offers the low voltage detection circuit wherein the load element is made of a resistor and a diode.

This invention also offers the low voltage detection circuit wherein the connecting node between the second transistor and the divider circuit is connected with a gate of the third transistor.

This invention also offers the low voltage detection circuit having a limiting resistor that limits the auxiliary current from the third transistor. This invention also offers the low voltage detection circuit wherein the third transistor is made of a P-channel type transistor.

BRIEF DESCRIPTION OF THE DRAWINGS

FIGS. 2A and 2B are charts showing operations of the low voltage detection circuit according to the embodiment of this invention.

DETAILED DESCRIPTION OF THE INVENTION

Figure 1:
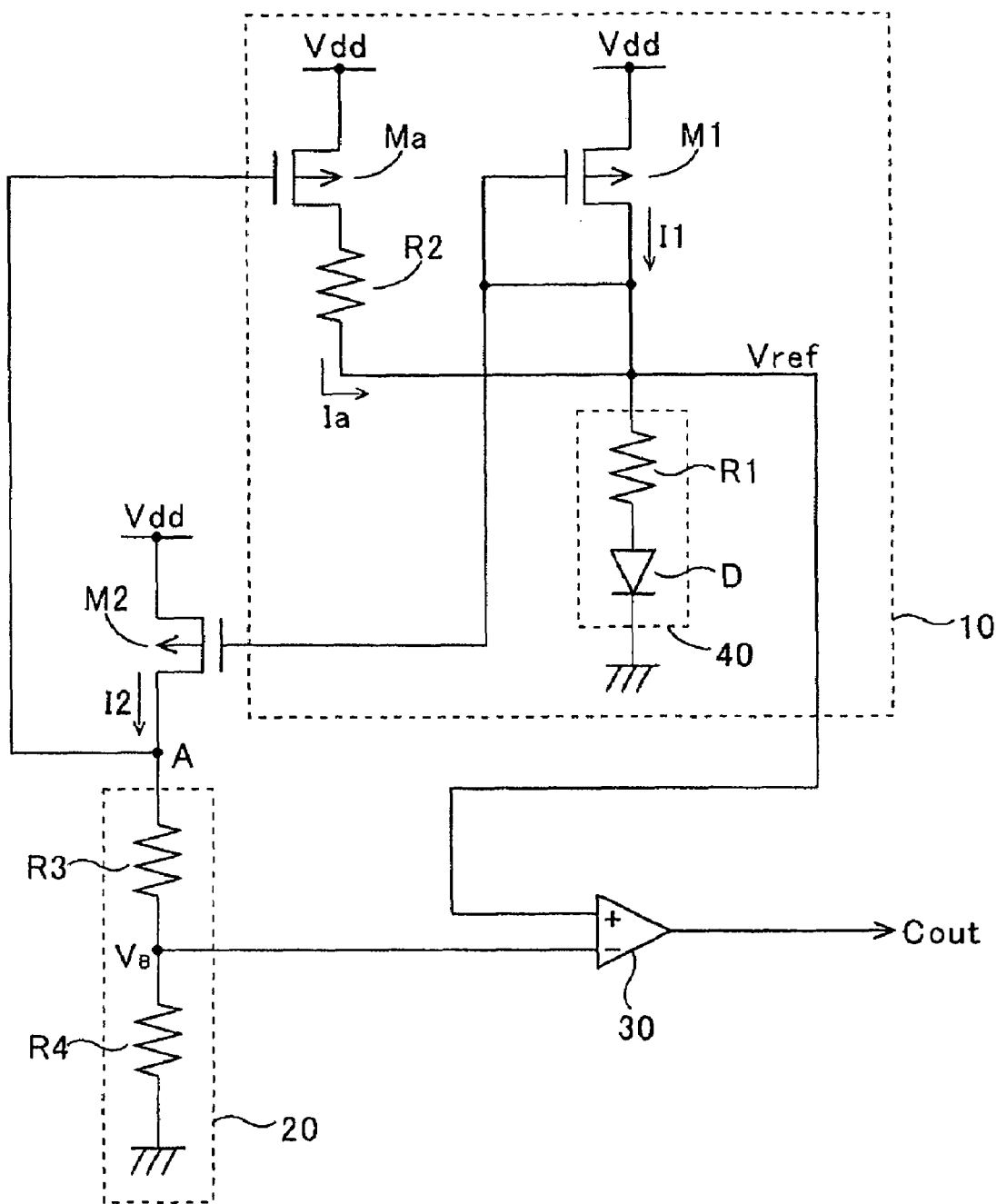
FIG. 1 is a circuit diagram showing a low voltage detection circuit according to an embodiment of this invention.
Figure 3:
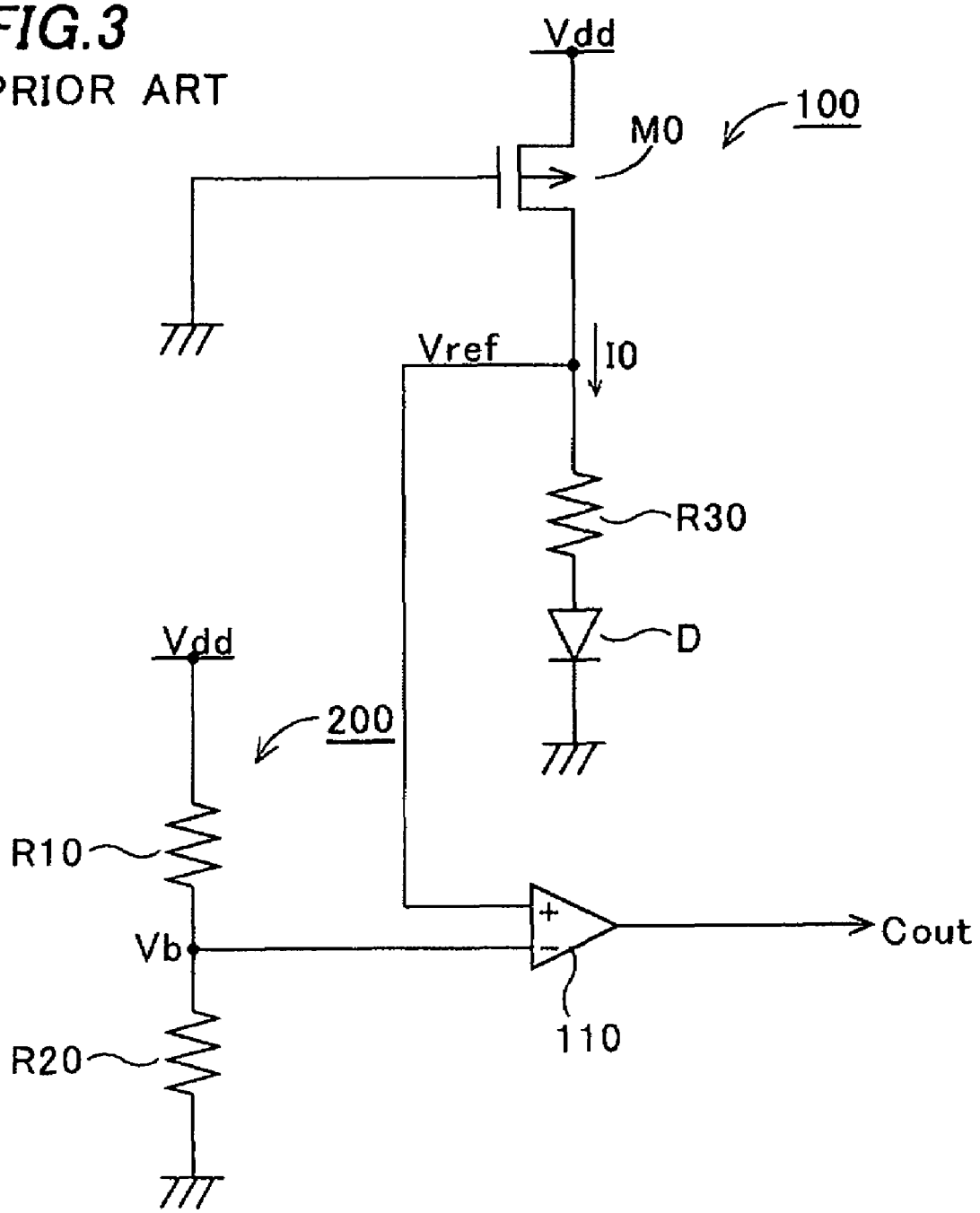
FIG. 3 is a circuit diagram showing a low voltage detection circuit according to a prior art.
Figure 4A:
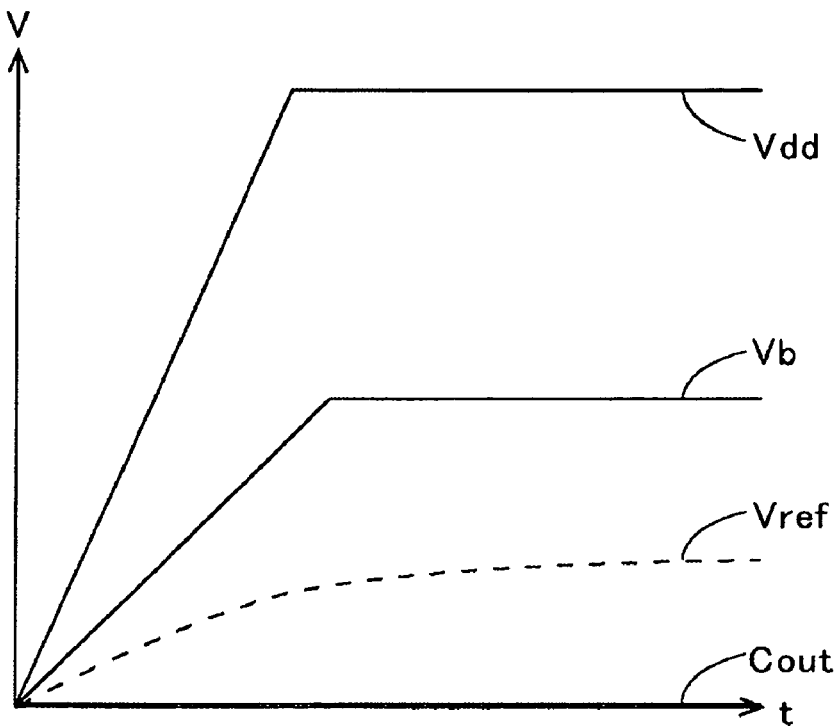
FIGS. 4A and 4B are charts showing operations of the low voltage detection circuit according to the prior art.
Figure 4B:
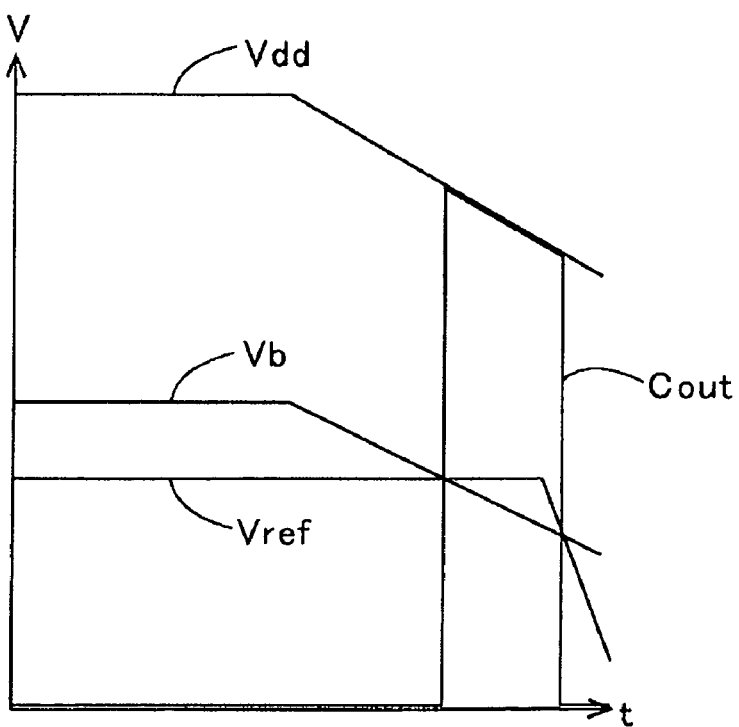

A low voltage detection circuit according to an embodiment of this invention will be explained hereafter, referring to the drawings.

FIG. 1 shows a circuit structure of the low voltage detection circuit according to the embodiment of this invention. The low voltage detection circuit is composed of a reference voltage generation circuit 10, a divider circuit 20, a comparator 30 that serves as a comparison circuit, and a second constant current transistor M2 connected in series with the divider circuit 20. In this embodiment, a power supply voltage Vdd in normal operation is set to 5.0 V, a reference voltage is set to 1.1 V and a divided voltage VB when the power supply voltage Vdd becomes to 3.0 V is set to 1.1 V.

The reference voltage generation circuit 10 is composed of a first constant current transistor M1 (a P-channel type transistor) that generates a first constant current I1 and a load element 40 (a resistor R1 and a diode D) connected with the first constant current transistor M1 in series, interposed between a power supply Vdd and a ground, and provides an input terminal (a non-inverting input terminal +) of the comparator 30 with the reference voltage Vref that is used for judging a reduction in the power supply voltage Vdd. A gate and a drain of the first constant current transistor M1 are connected. The components that make up the load element 40 may be modified as appropriate.

An auxiliary current transistor Ma (a P-channel type transistor) is connected with the load element 40 in series through a current limiting resistor R2. The auxiliary current transistor Ma is controlled by a drain voltage A at a drain of the second constant current transistor M2 that is to be described below. More specifically, the auxiliary current transistor Ma is turned off and does not provide the auxiliary current in the normal operation during which the drain voltage A is at a high level.

On the other hand, in a period during which the drain voltage A is at a low level, that is, immediately after power-on or when the power supply voltage Vdd is reduced, the auxiliary current transistor Ma provides the load element 40 with an auxiliary current Ia so as to raise the reference voltage Vref and maintain the reference voltage Vref at a constant voltage. The current limiting resistor R2 is disposed in order to limit the auxiliary current Ia and prevent excessive flowing.

The divider circuit 20 is composed of divider resistors R3 and R4 connected in series between the drain of the second constant current transistor M2 and the ground, and provides another input terminal (an inverting input terminal −) of the comparator 30 with the divided voltage VB of the power supply voltage Vdd.

The second constant current transistor M2 (a P-channel type transistor) is interposed between the power supply Vdd and the divider circuit 20 and serves as a current source to the divider circuit 20. A gate of the second constant current transistor M2 and the gate of the first constant current transistor M1 are connected with each other to form a current mirror.

A size of the second constant current transistor M2 is adjusted so that it can provide a second constant current I2 that is several times larger than the first constant current I1 flowing through the first constant current transistor M1 and that its ON resistance is negligibly small compared with a resistance of each of the divider resistors R3 and R4.

The drain voltage A of the second constant current transistor M2 (a voltage at a connecting node between the second constant current transistor M2 and the divider circuit 20) is applied to a gate of the auxiliary current transistor Ma. As a result, the auxiliary current transistor Ma is controlled by the drain voltage A.

The comparator 30 compares the divided voltage VB with the reference voltage Vref and outputs a low voltage detection signal Cout according to a result of the comparison. The low voltage detection signal Cout can be used as a reset (halt) pulse of an LSI such as a microcomputer.

Next, an operation of the low voltage detection circuit according to the embodiment is explained. First, the operation at power-on is explained referring to FIGS. 1 and 2A.

The drain voltage A of the second constant current transistor M2 is 0 volt at the power-on. Thus the auxiliary current transistor Ma is turned on to make the auxiliary current Ia flow. Because the load element 40 is provided with the auxiliary current Ia, it is made sure that the reference voltage Vref rises to follow a rise of the power supply voltage Vdd. Therefore, as shown in FIG. 2A, the low voltage detection signal Cout of the high level is outputted from the comparator 30 for the period between the time of the power-on and the time t1 that is a time shortly after the power-on, since the divided voltage VB is lower than the reference voltage Vref.

Next, when the power supply voltage Vdd drops during the normal operation is explained referring to FIGS. 1 and 2B. When the power supply voltage Vdd drops and the divided voltage VB is reduced to a voltage lower than the reference voltage Vref (1.1 V), the low voltage detection signal Cout of the high level (=Vdd level) is outputted.

When the power supply voltage Vdd further drops, the first constant current transistor M1 becomes unable to provide the load element 40 with the first constant current I1. In that case, the reference voltage Vref drops in the low voltage detection circuit according to the prior art.

In the low voltage detection circuit according to the embodiment of this invention, on the contrary, when the first constant current I1 becomes not provided, the drain voltage A of the second constant current transistor M2 is reduced because of the current mirror structure and subsequently the auxiliary current transistor Ma is turned on to provide the load element 40 with the auxiliary current Ia. Therefore, the reference voltage Vref is prevented from an abrupt drop and can be maintained at a predetermined voltage level. As a result, outputting the high level of the low voltage detection signal Cout can be maintained even after the power supply voltage Vdd drops and the divided voltage VB becomes below the reference voltage Vref.

As described above, it is made possible with the low voltage detection circuit according to the embodiment of this invention that the desired low voltage is securely detected to output the low voltage detection signal of the high level.

With the low voltage detection circuit according to the embodiment of this invention, the reference voltage Vref rises fast enough at the power-on. In the event that the power supply voltage Vdd drops during the normal operation, the drop in the reference voltage Vref due to the drop in the power supply voltage Vdd is prevented. As a result, precise and highly reliable low voltage detection at the power-on as well as during the normal operation is made possible.

Thus, when the low voltage detection circuit according to the embodiment of this invention is integrated into an LSI such as a microcomputer, desired reset operation can be reliably performed to prevent malfunctioning of the LSI.

What is claimed is:

1. A low voltage detection circuit comprising:
   a first transistor that is configured to generate a first constant current;
   a load element that generates a reference voltage corresponding to the first constant current;
   a second transistor that is configured to generate a second constant current that is proportional to the first constant current;
   a divider circuit that is connected in series with the second transistor and divides a power supply voltage;
   a third transistor that is controlled by a voltage at a connecting node between the second transistor and the divider circuit and provides the load element with an auxiliary current; and
   a comparator that compares the reference voltage with a divided power supply voltage obtained by dividing the power supply voltage by the divider circuit.

2. The low voltage detection circuit of claim 1, wherein the first transistor and the second transistor constitute a current mirror.

3. The low voltage detection circuit of claim 1, wherein the second constant current is larger than the first constant current.

4. The low voltage detection circuit of claim 2, wherein the second constant current is larger than the first constant current.

5. The low voltage detection circuit of claim 1, wherein the load element comprises a resistor and a diode.

6. The low voltage detection circuit of claim 1, wherein the second and third transistors are comprised by MOS transistors and, wherein the connecting node between the second transistor and the divider circuit is connected with a gate of the third transistor.

7. The low voltage detection circuit of claim 1, further comprising a resistor that limits the auxiliary current.

8. The low voltage detection circuit of claim 1, wherein the third transistor comprises a P-channel type MOS transistor.

* * * * *